United States Patent
Liu et al.

(10) Patent No.: US 11,716,823 B2
(45) Date of Patent: Aug. 1, 2023

(54) SUPPORT ASSEMBLY AND STORAGE AND DEPLOYMENT APPARATUS FOR FLEXIBLE DISPLAY PANEL

(71) Applicant: BOE TECHNOLOGY GROUP CO., LTD., Beijing (CN)

(72) Inventors: Junhuan Liu, Beijing (CN); Hong Zhu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/509,188

(22) Filed: Oct. 25, 2021

(65) Prior Publication Data
US 2022/0295649 A1  Sep. 15, 2022

(30) Foreign Application Priority Data

Mar. 9, 2021 (CN) .................. 202110255677.X

(51) Int. Cl.
  *H05K 5/02*  (2006.01)
  *G06F 1/16*  (2006.01)
(52) U.S. Cl.
  CPC ......... *H05K 5/0217* (2013.01); *G06F 1/1652* (2013.01)
(58) Field of Classification Search
  CPC .......................... H05K 5/0217; G06F 1/1652
  See application file for complete search history.

(56) References Cited

U.S. PATENT DOCUMENTS

| | | | | |
|---|---|---|---|---|
| 8,493,726 B2 * | 7/2013 | Visser | ..................... | G09F 9/301 361/679.05 |
| 9,655,267 B2 * | 5/2017 | Cope | ..................... | G09F 9/35 |
| 2010/0182738 A1 * | 7/2010 | Visser | ..................... | G06F 1/1615 361/679.01 |
| 2010/0246113 A1 * | 9/2010 | Visser | ..................... | G09F 9/301 361/679.3 |

(Continued)

FOREIGN PATENT DOCUMENTS

| | | |
|---|---|---|
| CN | 107424518 A | 12/2017 |
| CN | 107545849 A | 1/2018 |

(Continued)

OTHER PUBLICATIONS

China Patent Office, CN202110255677.X First Office Action dated Sep. 16, 2022.

*Primary Examiner* — Hung S. Bui
*Assistant Examiner* — Sagar Shrestha
(74) *Attorney, Agent, or Firm* — Houtteman Law LLC

(57) ABSTRACT

The present disclosure provides a support assembly and a storage and deployment apparatus for a flexible display panel. The support assembly of the present disclosure is configured to support a flexible display panel, and includes: a support structure configured to support the flexible display panel, and a driving structure configured to drive the support structure against the flexible display panel. At least a portion of the support structure is fixedly connected to the flexible display panel so that when the flexible display panel is reciprocated in a first direction and a second direction, the support structure is switchable between a first state and a second state. The support structure has a smaller support surface in the first state than in the second state, and the first direction is opposite to the second direction.

13 Claims, 3 Drawing Sheets

(56) References Cited

U.S. PATENT DOCUMENTS

| | | | | |
|---|---|---|---|---|
| 2012/0212433 | A1* | 8/2012 | Lee | G06F 1/1643 |
| | | | | 345/173 |
| 2013/0271940 | A1* | 10/2013 | Cope | H05K 5/0217 |
| | | | | 361/809 |
| 2017/0255232 | A1* | 9/2017 | Ram | G06F 1/1649 |
| 2017/0364121 | A1 | 12/2017 | Liu et al. | |
| 2018/0014417 | A1* | 1/2018 | Seo | H05K 1/189 |
| 2018/0225804 | A1* | 8/2018 | Lu | G06T 3/40 |
| 2022/0011821 | A1* | 1/2022 | Han | G06F 1/1624 |
| 2022/0357775 | A1* | 11/2022 | Choi | H04M 1/0268 |

FOREIGN PATENT DOCUMENTS

| | | |
|---|---|---|
| CN | 208044999 U | 11/2018 |
| WO | WO 2022085933 A1 | 4/2022 |

* cited by examiner

SUPPORT ASSEMBLY AND STORAGE AND DEPLOYMENT APPARATUS FOR FLEXIBLE DISPLAY PANEL

CROSS-REFERENCE TO RELATED APPLICATION

The present application claims priority to Chinese Patent Application 202110255677.X filed with the China National Intellectual Property Administration on Mar. 9, 2021, the disclosure of which is incorporated herein by reference in its entirety.

TECHNICAL FIELD

The present disclosure relates to the field of display module technology, and particularly relates to a support assembly and a storage and deployment apparatus for a flexible display panel.

BACKGROUND

With the continuous development of the display technology, the flexible display panel is made of a flexible material to form a deformable and flexible display device. Therefore, the flexible display panel is receiving more and more attention.

However, the flexible display panel tends to be damaged during use or transportation due to its characteristics, and thus, there is an urgent need for an apparatus capable of receiving or supporting a flexible display panel.

SUMMARY

The present disclosure solves, at least in part, the problem that the existing flexible display panel tends to be damaged by an external environment due to its high deformability, and provides a support assembly capable of supporting a flexible display panel.

In an aspect of the present disclosure, there is provided a support assembly for supporting a flexible display panel, including: a support structure configured to support the flexible display panel; and a driving structure configured to drive the support structure against the flexible display panel. wherein at least a portion of the support structure is fixedly connected to the flexible display panel so that when the flexible display panel is reciprocated in a first direction and a second direction, the support structure is switchable between a first state and a second state, wherein the support structure has a smaller support surface in the first state than in the second state, and the first direction is opposite to the second direction.

Optionally, the support structure includes a plurality of support plates, the support structure changes from a stacked state to a spliced state when the flexible display panel is moved in the first direction, and changes from the spliced state to the stacked state when the flexible display panel is moved in the second direction, wherein in the stacked state, the plurality of support plates are stacked on top of each other, and in the spliced state, the plurality of support plates are sequentially spliced into a flat plate shape.

Optionally, a first support plate of the plurality of support plates is fixedly connected to the flexible display panel.

Optionally, the driving structure includes: a bearing plate configured to bear the plurality of support plates in the stacked state; and an elastic member connected to the bearing plate and configured to apply a force toward the flexible display panel on the bearing plate so that the support plates on the bearing plate are driven to abut against the flexible display panel.

Optionally, each of the plurality of support plates includes: a connecting assembly configured to connect a support plate with an adjacent support plate to form the support structure in the spliced state.

Optionally, the support assembly further includes: an elastic toggler configured to connect the support plates with each other through the connecting assembly so that the support structure is in the spliced state.

Optionally, the connecting assembly includes: a first limiting slot located on a first surface of the support plate and opened toward a first edge of the support plate, the first surface being a surface opposite to the support surface of the support plate; a second limiting slot located on the first surface of the support plate and opened toward a second edge opposite to the first edge of the support plate, wherein in the spliced state, the first limiting slot and the second limiting slot of adjacent support plates form a cavity; and a limiting slider including a first part, a second part and a protruding part connecting the first part and the second part, wherein the first part is located in the first limiting slot and has a shape fitted with the first limiting slot, the second part has a shape fitted with the second limiting slot, the limiting slider is movable in the cavity, and in the spliced state, the first part of the limiting slider is located in the first limiting slot, the second part is located in the second limiting slot of the adjacent support plate, so that the two adjacent support plates are spliced together, and in the stacked state, the limiting slider is arranged only in the first limiting slot; wherein the elastic toggler changes a position of the limiting slider relative to the first limiting slot by toggling the protruding part of the limiting slider.

Optionally, the support assembly further includes: a first receiving structure configured to receive the plurality of support plates of the support structure in the stacked state, wherein the first receiving structure includes a bottom wall and a sidewall connected with the bottom wall, the elastic member is fixed on the bottom wall, the bearing plate is located in the first receiving structure, the bearing plate is movable within the first receiving structure under an action of the elastic member, and the first receiving structure limits movement of the bearing plate and the support structure in other directions than a direction perpendicular to the bottom wall.

Optionally, the elastic toggler is secured to the sidewall of the first receiving structure so that when the limiting slider passes through the elastic toggler, the elastic toggler generates a driving force on the protruding part of the limiting slider to move the limiting slider relative to the first limiting slot.

Optionally, at least one edge of each of the plurality of support plates has a wedge-shaped configuration.

Optionally, the first edge of the support plate forms an acute angle with the support surface of the support plate, and the second edge of the support plate forms an acute angle with the first surface of the support plate.

Optionally, the bearing surface of the bearing plate forms an acute angle with the first direction.

Optionally, the elastic member is a spring.

In another aspect of the present disclosure, there is further provided a storage and deployment apparatus for a flexible display panel, including: a second receiving structure configured to receive the flexible display panel in a rolled state; and the support assembly as described above.

Optionally, the storage and deployment apparatus further includes: a rotation shaft located in the second receiving structure, the flexible display panel being wound around an outer peripheral surface of the rotation shaft, wherein rotation of the rotation shaft drives the flexible display panel and the support structure of the support assembly to move in a first direction or a second direction.

BRIEF DESCRIPTION OF THE DRAWINGS

Accompanying drawings are provided for further understanding of this disclosure and constitute a part of the specification. Hereinafter, these drawings are intended to explain the disclosure together with the following specific embodiments, but should not be considered as a limitation to the disclosure. In the drawings.

Figure 1:
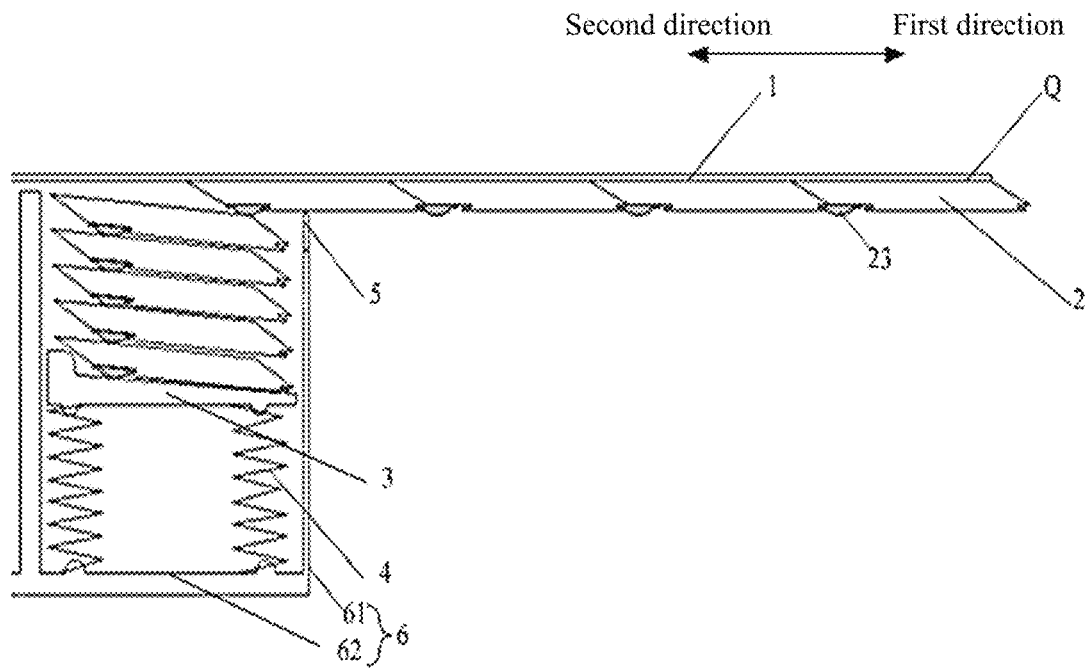
FIG. 1 is a schematic structural diagram of a support assembly according to an embodiment of the present disclosure.

The reference signs therein are listed below: 1. flexible display panel; 2. support plate; 21. first limiting slot; 22. second limiting slot; 23. limiting slider; 231. first part; 232. second part; 233. protruding part; 24. first edge; 25. second edge; 2a. first support plate; 2b. second support plate; 3. bearing plate; 4. elastic member; 5. elastic toggler; 6. first receiving structure; 61. sidewall; 62. bottom wall; and 7. second receiving structure.

DETAILED DESCRIPTION OF THE EMBODIMENTS

To improve understanding of the technical solution of the present disclosure for those skilled in the art, the present disclosure will now be described in detail with the help of accompanying drawings and specific embodiments.

The present disclosure will be described in more detail below with reference to the accompanying drawings. Throughout the drawings, the same elements are indicated by similar reference signs. For the sake of clarity, various parts in the figures are not drawn to scale. Moreover, some well-known parts may not be shown in the figures.

For better understanding of the present disclosure, many specific details of the disclosure are described below, such as structures, materials, dimensions, processing, and techniques of the components. However, the present disclosure may be implemented without these specific details, as will be understood by those skilled in the art.

As shown in FIGS. 1 to 6, this implementation provides a support assembly for supporting a flexible display panel 1, including: a driving structure and a support structure. The support structure is configured to support the flexible display panel 1; and the driving structure is configured to drive the support structure against the flexible display panel. At least a portion of the support structure is fixedly connected to the flexible display panel 1 so that when the flexible display panel 1 is reciprocated in a first direction and a second direction, the support structure is switchable between a first state and a second state. The support structure has a smaller support surface in the first state than in the second state, and the first direction is opposite to the second direction. Here, the fixed connection between the support structure and the flexible display panel may be in any manner as long as the fixed support structure can be moved synchronously with the flexible display panel.

In other words, a support surface of the support structure of the support assembly can be changed under a driving action of the driving structure and a traction action of the flexible display panel. Specifically, when the flexible display panel 1 needs a larger support surface, the support surface of the support assembly may be adjusted to be larger, and when the flexible display panel 1 needs a smaller support surface, the support surface of the support assembly may be adjusted to be smaller.

In this e implementation, a size of the support surface of the support assembly may be adjusted according to the requirements of the flexible display panel 1 so that the support assembly can adapt to different states of the flexible display panel 1, which can prevent damages to the flexible display panel 1 by the external environment, and facilitate use of the flexible display panel 1.

Optionally, the support structure includes a plurality of support plates 2. The support structure changes from a stacked state to a spliced state when the flexible display panel 1 is reciprocated in the first direction, and changes from the spliced state to the stacked state when the flexible display panel 1 is moved in the second direction. In the stacked state, the plurality of support plates 2 are stacked on top of each other, and in the spliced state, the plurality of support plates 2 are sequentially spliced into a flat plate shape.

A first state refers to the stacked state of the plurality of support plates 2, and a second state refers to the spliced state of the plurality of support plates 2.

Optionally, a first support plate of the plurality of support plates 2 is fixedly connected to the flexible display panel. For example, the support plate 2 connected to a connection end Q of the flexible display panel 1 is the first support plate 2, i.e., the uppermost support plate 2 in the stacked state.

Figure 4:
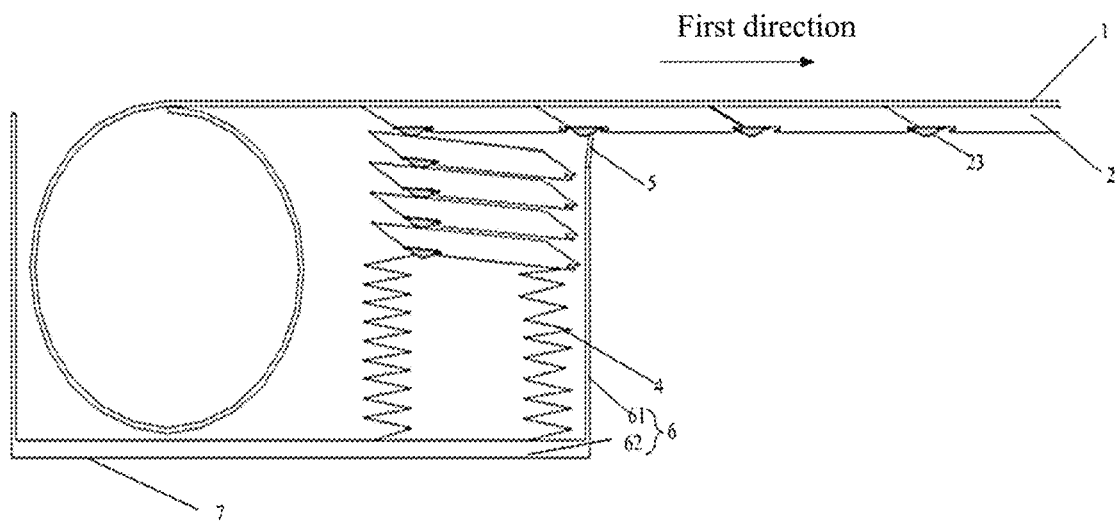
FIG. 4 is a schematic structural diagram of a storage and deployment apparatus for a flexible display panel according to an embodiment of the present disclosure in operation.
Figure 5:
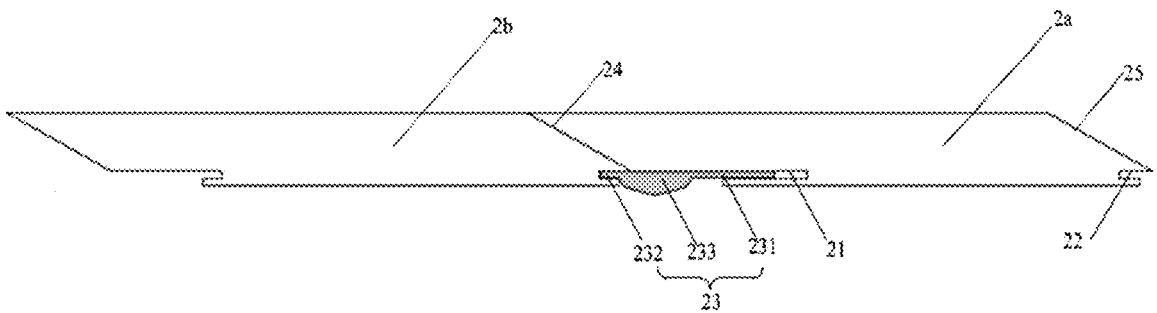
FIG. 5 is a partial schematic structural diagram of a storage and deployment apparatus for a flexible display panel according to an embodiment of the present disclosure.

When the flexible display panel 1 is moved in the first direction (as shown in FIG. 4), the plurality of support plates 2 are sequentially spliced one by one with movement of the flexible display panel 1, so as to adapt to a portion to be supported of the flexible display panel 1. Specifically, as shown in FIGS. 4 and 5, the uppermost first support plate 2a in the stacked state is firstly moved in the first direction along with the flexible display panel 1, and then, under driving of the driving structure, a second support plate 2b comes to abut against the flexible display panel 1 to be spliced with the first support plate 2a and then is moved in the first direction, so on and so forth.

Figure 3:
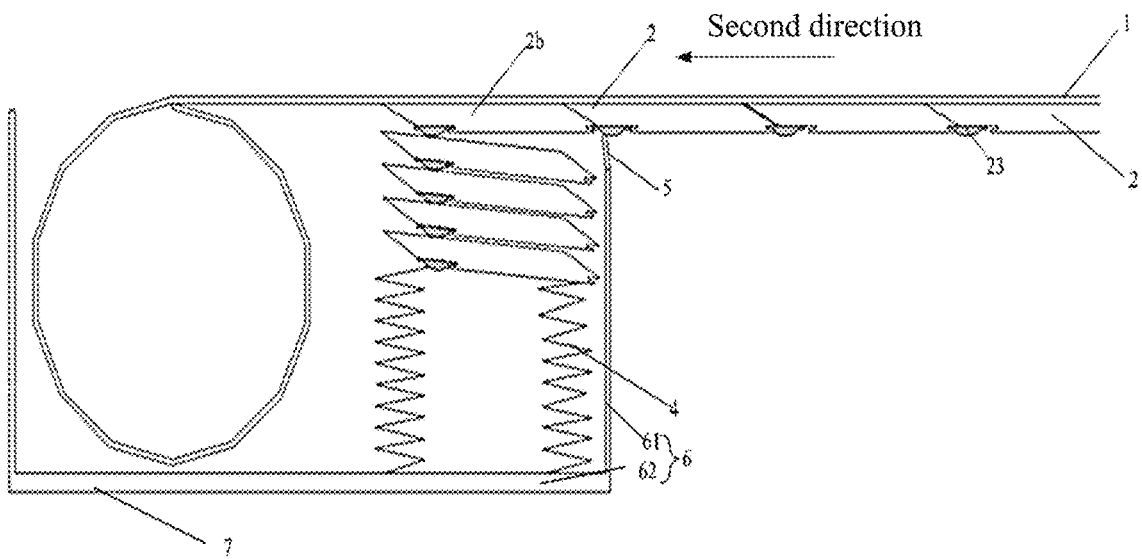
FIG. 3 is a schematic structural diagram of a storage and deployment apparatus for a flexible display panel according to an embodiment of the present disclosure in operation.

When the flexible display panel 1 is moved in the second direction (as shown in FIG. 3), the plurality of support plates 2 are sequentially stacked one by one with movement of the flexible display panel 1. Specifically, as shown in FIG. 3, the leftmost support plate 2 in the spliced state is firstly moved to a stacked position and separated from the flexible display panel 1, and then a support plate 2 adjacent to (right side of)

the leftmost support plate 2 is also moved to the stacked position and separated from the flexible display panel 1, so on and so forth.

Optionally, the driving structure includes: a bearing plate 3 and an elastic member 4. The bearing plate 3 is configured to bear the plurality of support plates 2 in the stacked state; and the elastic member 4 is connected to the bearing plate 3 and configured to apply a force toward the flexible display panel 1 on the bearing plate 3 so that the support plates 2 on the bearing plate 3 are driven to abut against the flexible display panel 1. This enables the support structure to be changed from the stacked state to the spliced state.

The support plates 2 in the stacked state are located on the bearing plate 3, and receive a force toward the flexible display panel 1 from the bearing plate 3 under the action of the elastic member 4. Specifically, when a stacked support plate 2 needs to be spliced with a previous support plate 2, the stacked support plate 2 may abut against the flexible display panel 1 by means of the elastic member 4, so as to be spliced with the previous support plate 2 and moved in the first direction.

It should be noted that when a support plate 2 is in contact with the flexible display panel 1, the flexible display panel 1 has a certain adsorption force to the support plate 2 so that the support plate 2 can be moved together with the flexible display panel 1. The adsorption force may be a weak adhesion force, namely a weak adhesive glue is coated on a lower surface of the flexible display panel 1 and an upper surface of the support plate 2; or may be a magnetic force, namely the lower surface of the flexible display panel 1 is a patterned metal, while the support plate 2 includes a magnetic material; or may be an Van der Waals force, namely the surface of one of the flexible display panel 1 and the support plate 2 is subjected to micro-nano engraving processing, and contacts the surface of the other to produce an Edward force.

Specifically, the elastic member 4 may be a spring, or may be any other suitable elastic member 4.

Optionally, at least one edge of each of the plurality of support plates 2 has a wedge-shaped configuration.

As shown in FIG. 3, when the plurality of support plates 2 are changed from the spliced state to the stacked state, since the first support plate 2a adjacent to the second support plate 2b continues to move toward the second direction, and since the flexible display panel 1 has a smaller adsorption force to the second support plate 2b, the wedge-shaped edge of the adjacent first support plate 2a may separate the second support plate 2b in the stacked position from the flexible display panel 1, and thus, the second support plate 2b no longer has a supporting function.

Optionally, each of the plurality of support plates 2 includes: a connecting assembly configured to connect a support plate 2 with an adjacent support plate 2 to form the support structure in the spliced state. Further optionally, the support assembly may further include: an elastic toggler 5 configured to connect the support plates 2 through the connecting assembly so that the support structure is in the spliced state.

The respective support plates 2 may be connected or disconnected by means of the connecting assembly.

It should be noted that the elastic toggler 5 may include a material of a high-elasticity metal or a rubber material.

Specifically, the connecting assembly includes: a first limiting slot 21, a second limiting slot 22 and a limiting slider 23. The first limiting slot 21 is located on a first surface of the support plate 2 and opened toward a first edge 24 of the support plate 2. The first surface is a surface opposite to the support surface of the support plate 2.

The second limiting slot 22 is located on the first surface of the support plate 2 and opened toward a second edge 25 opposite to the first edge 24 of the support plate 2, and in the spliced state, the first limiting slot 21 and the second limiting slot 22 of the adjacent support plates 2 form a cavity.

The limiting slider 23 includes a first part 231, a second part 232 and a protruding part 233 connecting the first part 231 and the second part 232. The first part 231 is located in the first limiting slot 21 and has a shape fitted with the first limiting slot 21. The second part 232 has a shape fitted with the second limiting slot 22. The limiting slider 23 is movable within the cavity formed by the first limiting slot 21 and the second limiting slot 22 of the adjacent support plates 2. In the spliced state, the first part 231 of the limiting slider 23 is located in the first limiting slot 21, the second part 232 is located in the second limiting slot 22 of the adjacent support plate 2, so that the two adjacent support plates 2 are spliced together, and in the stacked state, the limiting slider 23 is arranged only in the first limiting slot 21.

The elastic toggler 5 changes the position of the limiting slider 23 relative to the first limiting slot 21 by toggling the protruding part 233 of the limiting slider 23.

As shown in FIGS. 4 and 5, each support plate 2 has a first limiting slot 21 opened toward the first edge 24 and a second limiting slot 22 opened toward the second edge 25. For two adjacent support plates 2 (i.e., the first support plate 2a and the second support plate 2b) in the spliced state, the first edge 24 of the first support plate 2a and the second edge 25 of the second support plate 2b are spliced so that the first limiting slot 21 of the first support plate 2a corresponds to the second limiting slot 22 of the second support plate 2b to form a cavity, while the first part 231 of the limiting slider 23 of the first support plate 2a is located in the first limiting slot 21 of the first support plate 2a.

When the flexible display panel 1 is moved in the first direction (as shown in FIG. 5), the plurality of support plates 2 need to be sequentially spliced one by one with movement of the flexible display panel 1. Specifically, as shown in FIG. 5, under the action of the elastic toggler 5, the limiting slider 23 located in the first limiting slot 21 of the first support plate 2a moves the second part 232 of the limiting slider 23 into the second limiting slot 22 of the second support plate 2b so that the limiting slider 23 of the first support plate 2a is simultaneously clamped in the first limiting slot 21 of the first support plate 2a and the second limiting slot 22 of the second support plate 2b, so as to limit the first support plate 2a and the second support plate 2b, prevent relative sliding movement between the first support plate 2a and the second support plate 2b, and ensure stability of the support surface formed by the first support plate 2a and the second support plate 2b.

Figure 6:
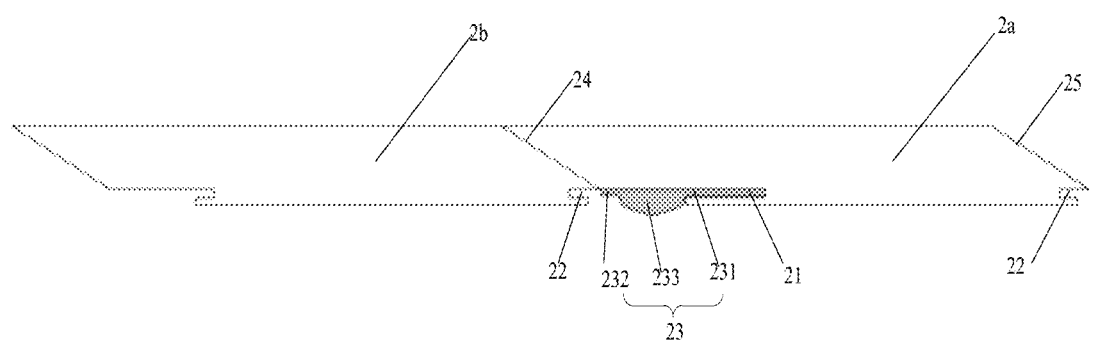
FIG. 6 is a partial schematic structural diagram of a storage and deployment apparatus for a flexible display panel according to an embodiment of the present disclosure.

When the flexible display panel 1 is moved in the second direction (as shown in FIG. 6), the plurality of support plates 2 need to be sequentially stacked one by one with movement of the flexible display panel 1. Specifically, as shown in FIG. 6, under the action of the elastic toggler 5, the limiting slider 23 located in the first limiting slot 21 of the first support plate 2a moves the second part 232 of the limiting slider 23 out of the second limiting slot 22 of the second support plate 2b so that the limiting slider 23 of the first support plate 2a is only arranged in the first limiting slot 21 of the first support plate 2a, thereby releasing the spliced state of the first support plate 2a and the second support plate 2b.

It should be noted that the limiting slider 23 may be made of a polyoxymethylene (POM) material, which may be self-lubricating between the first limiting slot 21 of the first support plate 2a and the second limiting slot 22 of the second support plate 2b.

Optionally, the support assembly in this implementation further includes: a first receiving structure 6 configured to receive the plurality of support plates 2 of the support structure in the stacked state. The first receiving structure 6 includes a bottom wall 62 and a sidewall 61 connected with the bottom wall 62. The elastic member 4 is fixed on the bottom wall 62, and the bearing plate 3 is located in the first receiving structure 6. The bearing plate 3 is movable within the first receiving structure 6 under an action of the elastic member 4, and the first receiving structure 6 limits movement of the bearing plate 3 and the support structure in other directions than a direction perpendicular to the bottom wall.

Figure 2:
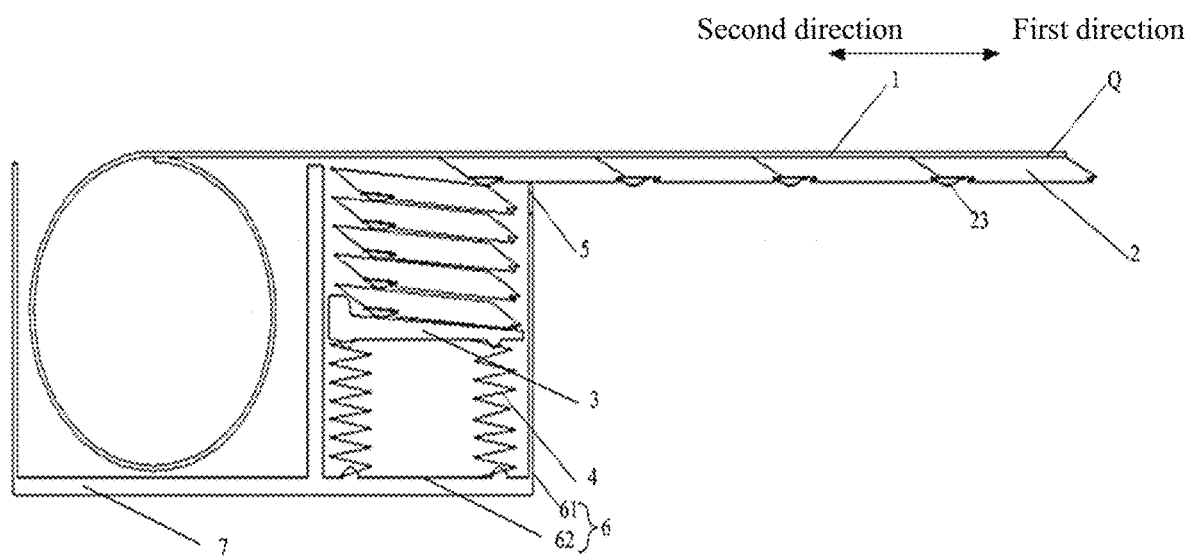
FIG. 2 is a schematic structural diagram of a storage and deployment apparatus for a flexible display panel according to an embodiment of the present disclosure.

As shown in FIG. 2, the first receiving structure 6 is configured to receive the support plates 2 in the stacked state. The first receiving structure 6 may have a substantially cylindrical shape, and an inner diameter of the cylinder is substantially the same with a length of the bearing plate 3 and a length of the support plate 2. This allows for a minimum space occupied by the support plates 2 when not used for supporting, and meanwhile, the first receiving structure 6 can limit movement of the bearing plate 3 and the support structure in other directions than a direction perpendicular to the bottom wall. As shown in FIG. 2, the first receiving structure 6 allows movement of the bearing plate 3 and the support structure in the vertical direction, but restricts movement in other directions than the vertical direction. This prevents lateral deviations when the support structure is in the stacked state.

The elastic member 4 and the bearing plate 3 are both located in the first receiving structure 6. Taking the elastic member 4 being a spring as an example, it has one end connected to the bottom wall 61 of the first receiving structure 6, and the other end connected to a lower surface of the bearing plate 3, which can guarantee stability of the entire driving structure and thus automatic stacking and splicing of the plurality of support plates 2.

Optionally, the elastic toggler 5 is secured to the sidewall 62 of the first receiving structure 6 so that when the limiting slider 23 passes through the elastic toggler 5, the elastic toggler 5 generates a driving force on the protruding part 233 of the limiting slider 23 to move the limiting slider 23 relative to the first limiting slot 21.

Specifically, the elastic toggler 5 is secured to the sidewall 62 of the first receiving structure 6, and while the support plates 2 are changed from the stacked state to the spliced state, or from the spliced state to the stacked state, the limiting slider 23 passes through the elastic toggler 5 so that the elastic toggler 5 generates a driving force on the protruding part 233 of the limiting slider 23. Optionally, the elastic toggler 5 may be secured to the sidewall 62 by an integral injection molding or insert process.

When the flexible display panel 1 is moved in the first direction, the plurality of support plates 2 need to be sequentially spliced one by one with movement of the flexible display panel 1. Specifically, as shown in FIGS. 4 and 5, when the limiting slider 23 located in the first limiting slot 21 of the first support plate 2a passes through the elastic toggler 5, since the elastic toggler 5 applies a force toward the second direction on the protruding part 233 of the limiting slider 23 so that the second part 232 of the limiting slider 23 is moved into the second limiting slot 22 of the second support plate 2b, the limiting slider 23 of the first support plate 2a is simultaneously clamped in the first limiting slot 21 of the first support plate 2a and the second limiting slot 22 of the second support plate 2b, so as to limit the first support plate 2a and the second support plate 2b, prevent relative sliding movement between the first support plate 2a and the second support plate 2b, and ensure stability of the support surface formed by the first support plate 2a and the second support plate 2b.

When the flexible display panel 1 is moved in the second direction, the plurality of support plates 2 need to be sequentially stacked one by one with movement of the flexible display panel 1. Specifically, as shown in FIGS. 3 and 6, when the limiting slider 23 located in the first limiting slot 21 of the first support plate 2a passes through the elastic toggler 5, since the elastic toggler 5 applies a force toward the first direction on the protruding part 233 of the limiting slider 23 so that the second part 232 of the limiting slider 23 is moved out of the second limiting slot 22 of the second support plate 2b, the limiting slider 23 of the first support plate 2a is only located in the first limiting slot 21 of the first support plate 2a, thereby releasing the spliced state of the first support plate 2a and the second support plate 2b.

Optionally, the first edge 24 of the support plate 2 forms an acute angle with the support surface of the support plate 2, and the second edge 25 of the support plate 2 forms an acute angle with the first surface of the support plate 2. As shown in FIG. 5, each support plate 2 has two opposite edges each provided with a wedge-shaped configuration. Thereby, as shown in FIG. 3, when the plurality of support plates 2 are changed from the spliced state to the stacked state, the wedge-shaped edges of the adjacent first support plate 2a may separate the second support plate 2b in the stacked position from the flexible display panel 1 more easily.

Optionally, the bearing surface of the bearing plate 3 forms an acute angle with the first direction. This arrangement of the bearing plate 3 facilitates the separation between the support plate 2 and the flexible display panel 1. Since the bearing surface of the bearing plate 3 forms an acute angle with the first direction, the bearing plate 3 only provides a larger supporting force to one side edge of the support plate 2, while the other side edge of the support plate 2 can be more easily separated from the flexible display panel 1 under pressing of the wedge-shaped edge of the adjacent support plate.

With the support assembly in this implementation, a plurality of support plates 2 can be automatically changed from a stacked state to a spliced state, or from a spliced state to a stacked state, through mutual cooperation of the driving structure and the support structure, and a size of the support surface can be adjusted according to the requirements of the flexible display panel 1 so that the support assembly can adapt to different states of the flexible display panel 1, which can prevent damages to the flexible display panel 1 by the external environment, and facilitate use of the flexible display panel 1, while facilitating storage of the flexible display panel 1 and reducing the occupied space.

As shown in FIGS. 1 to 6, this implementation provides a storage and deployment apparatus for a flexible display panel 1, including: a second receiving structure 7 and the support assembly as described above. The second receiving structure 7 is configured to receive the flexible display panel 1 in a rolled state; and the support assembly is the support assembly described in the previous implementation.

Specifically, the storage and deployment apparatus for the flexible display panel 1 of this implementation further includes: a rotation shaft located in the second receiving structure 7, the flexible display panel 1 being wound around an outer peripheral surface of the rotation shaft. Rotation of the rotation shaft drives the flexible display panel 1 and the support structure of the support assembly to move in a first direction or a second direction.

When the flexible display panel 1 is not in use, the flexible display panel 1 may be wound around the outer peripheral surface of the rotation shaft. When the flexible display panel 1 is to be used, i.e., to be unfolded, the flexible display panel 1 is gradually separated from the outer peripheral surface of the rotation shaft as one end of the flexible display panel 1 moves in the first direction, and then is supported by the support assembly.

Specifically, when the flexible display panel 1 is moved in the first direction (as shown in FIGS. 4 and 5), the plurality of support plates 2 need to be sequentially spliced one by one with movement of the flexible display panel 1. Specifically, as shown in the figure, when the limiting slider 23 located in the first limiting slot 21 of the first support plate 2*a* passes through the elastic toggler 5, since the elastic toggler 5 applies a force toward the second direction on the protruding part 233 of the limiting slider 23 so that the second part 232 of the limiting slider 23 is moved into the second limiting slot 22 of the second support plate 2*b*, the limiting slider 23 of the first support plate 2*a* is simultaneously clamped in the first limiting slot 21 of the first support plate 2*a* and the second limiting slot 22 of the second support plate 2*b*, so as to limit the first support plate 2*a* and the second support plate 2*b*, prevent relative sliding movement between the first support plate 2*a* and the second support plate 2*b*, and ensure stability of the support surface formed by the first support plate 2*a* and the second support plate 2*b*.

When the flexible display panel 1 is moved in the second direction (as shown in FIGS. 3 and 6), the plurality of support plates 2 need to be sequentially stacked one by one with movement of the flexible display panel 1. Specifically, as shown in the figure, when the limiting slider 23 located in the first limiting slot 21 of the first support plate 2*a* passes through the elastic toggler 5, since the elastic toggler 5 applies a force toward the first direction on the protruding part 233 of the limiting slider 23 so that the second part 232 of the limiting slider 23 is moved out of the second limiting slot 22 of the second support plate 2*b*, the limiting slider 23 of the first support plate 2*a* is only located in the first limiting slot 21 of the first support plate 2*a*, thereby releasing the spliced state of the first support plate 2*a* and the second support plate 2*b*.

With the storage and deployment apparatus for the flexible display panel 1 in this implementation, a plurality of support plates 2 can be automatically changed from a stacked state to a spliced state, or from a spliced state to a stacked state, through mutual cooperation of the driving structure and the support structure, and a size of the support surface can be adjusted according to the requirements of the flexible display panel 1 so that the support assembly can adapt to different states of the flexible display panel 1, which can prevent damages to the flexible display panel 1 by the external environment, and facilitate use of the flexible display panel 1, while facilitating storage of the flexible display panel 1 and reducing the occupied space.

It should be noted that, in this context, relational terms such as first and second, are used merely to distinguish one entity or operation from another without necessarily requiring or implying that there is any such actual relationship or order between such entities or operations. Moreover, the term "comprise," "comprising" or any variant thereof means to be non-exclusive so that a process, method, item or device including a series of elements includes not only said elements, but also other elements not explicitly listed, or inherent elements of such processes, methods, items or devices. In the absence of more limitations, an element defined by "comprising a . . . " do not exclude the existence of additional identical elements in the process, method, item or device including the element.

The embodiments of the present disclosure are as described above, where not all details of the embodiments are elaborated, and the present disclosure is not intended to be limited to these specific embodiments. Obviously, many modifications and variations are possible in light of the above description. The present disclosure has chosen and described these specific embodiments in detail for better illustration of the principles and actual applications of the present disclosure so that those skilled in the art can make good use of the present disclosure as well as modified applications based on the present disclosure. The present disclosure is intended to be limited only by the claims and the full scope and equivalents thereof.

What is claimed is:

1. A support assembly for supporting a flexible display panel, comprising:
    a support structure configured to support the flexible display panel; and
    a driving structure configured to drive the support structure against the flexible display panel,
    wherein at least a portion of the support structure is fixedly connected to the flexible display panel so that when the flexible display panel is reciprocated in a first direction and a second direction, the support structure is switchable between a first state and a second state, wherein the support structure has a smaller support surface in the first state than in the second state, and the first direction is opposite to the second direction,
    wherein the support structure comprises a plurality of support plates, the support structure changes from a stacked state to a spliced state when the flexible display panel is moved in the first direction, and changes from the spliced state to the stacked state when the flexible display panel is moved in the second direction, wherein in the stacked state, the plurality of support plates are stacked on top of each other, and in the spliced state, the plurality of support plates are sequentially spliced into a flat plate shape,
    wherein the driving structure comprises:
    a bearing plate configured to bear the plurality of support plates in the stacked state; and
    an elastic member connected to the bearing plate and configured to apply a force toward the flexible display panel on the bearing plate so that the support plates on the bearing plate are driven to abut against the flexible display panel.

2. The support assembly according to claim 1, wherein a first support plate of the plurality of support plates is fixedly connected to the flexible display panel.

3. The support assembly according to claim 1, wherein each of the plurality of support plates comprises:
    a connecting assembly configured to connect a support plate with an adjacent support plate to form the support structure in the spliced state.

4. The support assembly according to claim 3, wherein the support assembly further comprises: an elastic toggler configured to connect the support plates with each other through the connecting assembly so that the support structure is in the spliced state.

5. The support assembly according to claim 4, wherein the connecting assembly comprises:

a first limiting slot located on a first surface of the support plate and opened toward a first edge of the support plate, the first surface being a surface opposite to the support surface of the support plate;

a second limiting slot located on the first surface of the support plate and opened toward a second edge opposite to the first edge of the support plate, wherein in the spliced state, the first limiting slot and the second limiting slot of adjacent support plates form a cavity;

a limiting slider comprising a first part, a second part and a protruding part connecting the first part and the second part, wherein the first part is located in the first limiting slot and has a shape fitted with the first limiting slot, the second part has a shape fitted with the second limiting slot, the limiting slider is movable in the cavity, and in the spliced state, the first part of the limiting slider is located in the first limiting slot, the second part is located in the second limiting slot of the adjacent support plate, so that the two adjacent support plates are spliced together, and in the stacked state, the limiting slider is arranged only in the first limiting slot;

wherein the elastic toggler changes a position of the limiting slider relative to the first limiting slot by toggling the protruding part of the limiting slider.

6. The support assembly according to claim 5, wherein the first edge of the support plate forms an acute angle with the support surface of the support plate, and the second edge of the support plate forms an acute angle with the first surface of the support plate.

7. The support assembly according to claim 6, wherein the bearing surface of the bearing plate forms an acute angle with the first direction.

8. The support assembly according to claim 1, wherein the support assembly further comprises:

a first receiving structure configured to receive the plurality of support plates of the support structure in the stacked state, wherein the first receiving structure comprises a bottom wall and a sidewall connected with the bottom wall, the elastic member is fixed on the bottom wall, the bearing plate is located in the first receiving structure, the bearing plate is movable within the first receiving structure under an action of the elastic member, and the first receiving structure limits movement of the bearing plate and the support structure in other directions than a direction perpendicular to the bottom wall.

9. The support assembly according to claim 8, wherein the elastic toggler is secured to the sidewall of the first receiving structure so that when the limiting slider passes through the elastic toggler, the elastic toggler generates a driving force on the protruding part of the limiting slider to move the limiting slider relative to the first limiting slot.

10. The support assembly according to claim 1, wherein at least one edge of each of the plurality of support plates has a wedge-shaped configuration.

11. The support assembly according to claim 1, wherein the elastic member is a spring.

12. A storage and deployment apparatus for a flexible display panel, comprising:

a second receiving structure configured to receive the flexible display panel in a rolled state; and the support assembly according to claim 1.

13. The storage and deployment apparatus according to claim 12, further comprising:

a rotation shaft located in the second receiving structure, the flexible display panel being wound around an outer peripheral surface of the rotation shaft, wherein rotation of the rotation shaft drives the flexible display panel and the support structure of the support assembly to move in a first direction or a second direction.

* * * * *